(12) United States Patent
Taniguchi et al.

(10) Patent No.: US 7,971,159 B2
(45) Date of Patent: Jun. 28, 2011

(54) DATA GENERATING METHOD, DATA GENERATING DEVICE, AND PROGRAM IN AN EXPOSURE SYSTEM FOR IRRADIATING MULTIGRADATION-CONTROLLABLE SPOTLIGHTS

(75) Inventors: Yoshiyuki Taniguchi, Kumamoto (JP); Tatsuo Morimoto, Miyagi (JP); Akira Nakada, Kumamoto (JP); Masae Nakada, legal representative, Ishikawa (JP); Tadahiro Ohmi, Miyagi (JP)

(73) Assignees: Tohoko University, Miyagi (JP); Kumamoto University, Kumamoto (JP)

( * ) Notice: Subject to any disclaimer, the term of this patent is extended or adjusted under 35 U.S.C. 154(b) by 490 days.

(21) Appl. No.: 11/887,966

(22) PCT Filed: Apr. 7, 2006

(86) PCT No.: PCT/JP2006/307430
§ 371 (c)(1),
(2), (4) Date: Nov. 15, 2007

(87) PCT Pub. No.: WO2006/109709
PCT Pub. Date: Oct. 19, 2006

(65) Prior Publication Data
US 2008/0189674 A1    Aug. 7, 2008

(30) Foreign Application Priority Data
Apr. 7, 2005   (JP) ................. 2005-110819

(51) Int. Cl.
*G06F 17/50* (2006.01)
(52) U.S. Cl. .......................... 716/55; 716/50
(58) Field of Classification Search .............. 716/19–21, 716/50, 55; 430/5, 30
See application file for complete search history.

(56) References Cited

U.S. PATENT DOCUMENTS

| | | | | |
|---|---|---|---|---|
| 4,789,611 A | * | 12/1988 | Miyahara | 430/5 |
| 4,912,568 A | * | 3/1990 | Shimano | 358/3.09 |
| 6,428,940 B1 | | 8/2002 | Sandstrom | |
| 2005/0280695 A1 | * | 12/2005 | Groenen et al. | 347/238 |
| 2006/0147841 A1 | | 7/2006 | Ohmi et al. | |

FOREIGN PATENT DOCUMENTS

| WO | WO-03/052516 | 6/2003 |
|---|---|---|
| WO | WO-2004/095549 | 11/2004 |

OTHER PUBLICATIONS

Ljungblad et al., "New Architecture for Laser Pattern Generators for 130 nm and Beyond," 20th Annual BACUS Symposium on Photomask Technology, vol. 4186, 2001, pp. 16-21.

* cited by examiner

*Primary Examiner* — Vuthe Siek
(74) *Attorney, Agent, or Firm* — Foley & Lardner LLP

(57) ABSTRACT

To provide a data generating method, device, and program that can generate drawing data for drawing the entire general design graphic data with an accuracy of about 1 to 4 nm in a drawing method or a drawing system adapted to draw gradation-controllable spotlights in a two-dimensional array. The data generating method is a method for generating, in an exposure system having a function of irradiating multigradation-controllable spotlights in a two-dimensional array onto a photosensitive film on a substrate, gradation values of the spotlights based on design graphic data. Using reference data classified by features of a graphic and describing in advance combinations of gradation values mapped to coordinate information of a graphic, the method discriminates the feature in the design graphic data near positions of the spotlights and selects the combination of the gradation values in the reference data corresponding to coordinate information of the positions of the spotlights, thereby determining the gradation values.

21 Claims, 14 Drawing Sheets

DATA GENERATING METHOD, DATA GENERATING DEVICE, AND PROGRAM IN AN EXPOSURE SYSTEM FOR IRRADIATING MULTIGRADATION-CONTROLLABLE SPOTLIGHTS

This application is the National Phase of PCT/JP2006/307430, filed Apr. 7, 2006, which claims priority to Japanese Application No. 2005-110819, filed Apr. 7, 2005. The contents of the foregoing applications are incorporated by reference in their entirety.

TECHNICAL FIELD

This invention relates to patterning of a photomask, a semiconductor integrated circuit, a microelectronic device, a micro-optical device, and a display device, i.e. relates to an algorithm for converting graphic data drawn by CAD or the like into drawing data necessary for a patterning process, that is, to a drawing data conversion method.

BACKGROUND ART

Generally, in a patterning process at the time of manufacturing a semiconductor integrated circuit, it is necessary to form a circuit pattern on a wafer coated with a resist by the use of a photomask (also called a reticle) with the circuit pattern drawn thereon (which is called pattern exposure or pattern drawing), and a system therefor is called an exposure system or an exposure apparatus.

On the other hand, in order to fabricate a photomask, it is necessary to provide, on the surface of a quartz plate or the like which will serve as a substrate of the photomask, a chromium film or the like for shielding exposure light in a pattern corresponding to an intended circuit pattern. This chromium film is formed by pattern drawing and, as a general system for performing such pattern drawing, an electron-beam mask drawing system (hereinafter abbreviated as an EB drawing system) using an electron beam is widely used.

In recent years, for adaptation to highly integrated and miniaturized semiconductor integrated circuits, the prices of photomasks have been increasing. One of causes of this is that as long as several tens of hours to several hundreds of hours are required for drawing each photomask by an EB drawing system.

Apart from the EB drawing system, a system based on a technique that performs pattern drawing using laser light in the ultraviolet region, which is called a laser-beam drawing system, has also been commercialized as a drawing system for use in the manufacture of photomasks.

As a conventional example of such a system, it uses a reflector display element (a mirror device called micromirrors or the like) having a large number of micromirrors arranged in a two-dimensional array and performs pattern drawing on a photomask substrate by irradiating laser light in the ultraviolet region onto the reflector display element and controlling reflected light therefrom into a pattern. This laser-beam drawing system can collectively draw a portion of a circuit pattern and therefore has an advantage that the drawing speed is fast. This is shown, for example, in Non-Patent Document 1 or Patent Document 1.

According thereto, in a laser-beam drawing system using a mirror device, the mirror device uses about one million (about 500×about 2000) micromirrors and each micromirror has a size with each side being about 16 µm. This is reduction-projected onto a photomask substrate at 1/160 magnification through a reduction-projection optical system.

As a result, a pattern corresponding to each micromirror (which is called a spotlight) becomes a square with each side of 0.1 µm, i.e. 100 nm (actually, it becomes a scattered light close to a circle with about φ100 nm due to a light-source wavelength limit). However, the minimum size (called a minimum grid) in design when drawing a photomask is 1 to 4 nm, which is far smaller than the spotlight. Therefore, the resolution of pattern drawing is improved by changing an amount of light irradiated onto a pattern to be projected. For example, according to the foregoing document, the amount of light is changed in 64 levels (using intermediate amounts of light), thereby adapting to a minimum grid of 1.56 nm being 1/64 of 100 nm. In such a drawing method using gradation-controllable spotlights, it is necessary to prepare in advance patterns to be displayed on a mirror device and display the patterns at proper positions on a photomask. The patterns to be displayed on the mirror device, position information, and so on are called drawing data and generally generated from a desired pattern (design graphic data) by a conversion program.

In the drawing system using gradation-controllable spotlights in a two-dimensional array like the foregoing laser-beam drawing system, it has been difficult to generate drawing data from design graphic data. There are roughly two causes for this. One is that while the size of each spotlight is about φ100 nm, the pattern accuracy to be controlled requires a very small value of about 1 to 4 nm. The second is that since the size of the spotlight is smaller than the wavelength of a light source, the spotlight is in the form of a scattered light. For these causes, the amount of light of each spotlight should be adjusted while taking into account overlapping with the adjacent spotlights around it. Although the pattern can be drawn with the intended accuracy in principle, the drawing accuracy remains at about several tens to several hundreds of nm when drawing general design graphic data (drawing is enabled with the intended accuracy for a very limited, simple pattern). Therefore, a method of generating a drawing data has been required which can drawing the entire general design graphic data with the accuracy of about 1 to 4 nm currently required for the photomask fabrication.

Non-Patent Document 1: Proceedings of SPIE, Vol. 4186, p.p. 16-21
Patent Document 1: U.S. Pat. No. 6,428,940

DISCLOSURE OF THE INVENTION

Problem to be Solved by the Invention

It is therefore a technical object of this invention to provide a data generating method, device, and program that can generate drawing data for drawing the entire general design graphic data with an accuracy of about 1 to 4 nm in a drawing method or a drawing system adapted to draw gradation-controllable spotlights in a two-dimensional array.

Means for Solving the Problem

According to one aspect of this invention, there is provided a method of generating, in an exposure system having a function of irradiating multigradation-controllable spotlights in a two-dimensional array onto a photosensitive film on a substrate, gradation values of the spotlights based on design graphic data. In the aspect of the present invention, the method includes the steps of:

using reference data classified by features of a graphic and describing in advance combinations of gradation values mapped to coordinate information of a graphic;

discriminating the feature in the design graphic data near positions of the spots; and selecting the combination of the gradation values in the reference data corresponding to coordinate information of the positions of the spots, thereby determining the gradation values.

According to one aspect of this invention, there is provided a device for generating data, in an exposure system having a function of irradiating multigradation-controllable spotlights in a two-dimensional array onto a photosensitive film on a substrate, gradation values of the spotlights based on design graphic data. In the aspect of the present invention, the device includes gradation value determining means for using reference data classified by features of a graphic and describing in advance combinations of gradation values mapped to coordinate information of a graphic, and for discriminating the feature in the design graphic data near positions of the spots, and for selecting the combination of the gradation values in the reference data corresponding to coordinate information of the positions of the spots, thereby determining the gradation values.

According to still another aspect of this invention, there is provides a program for generating, in an exposure system having a function of irradiating multigradation-controllable spotlights in a two-dimensional array onto a photosensitive film on a substrate, gradation values of the spotlights based on design graphic data. The program includes gradation value determining means for using reference data classified by features of a graphic and describing in advance combinations of gradation values mapped to coordinate information of a graphic, and for discriminating the feature in the design graphic data near positions of the spots, and for selecting the combination of the gradation values in the reference data corresponding to coordinate information of the positions of the spots, thereby determining the gradation values.

According to yet another aspect of this invention, there is provided an exposure system having a function of irradiating multigradation-controllable spotlights in a two-dimensional array onto a photosensitive film on a substrate. The exposure system includes data generating means for generating drawing data and control means for controlling irradiation positions of the spotlights and exposure of the spotlights based on the drawing data from the data generating means. In the exposure system, the data generating means includes the data generating device above-mentioned.

EFFECT OF THE INVENTION

According to a drawing data generating method, device, and program of this invention, it becomes possible to generate drawing data for drawing the entire general design graphic data with an accuracy of about 1 to 4 nm in a drawing method adapted to draw gradation-controllable spotlights in a two-dimensional array.

BEST MODE FOR CARRYING OUT THE INVENTION

Figure 1:
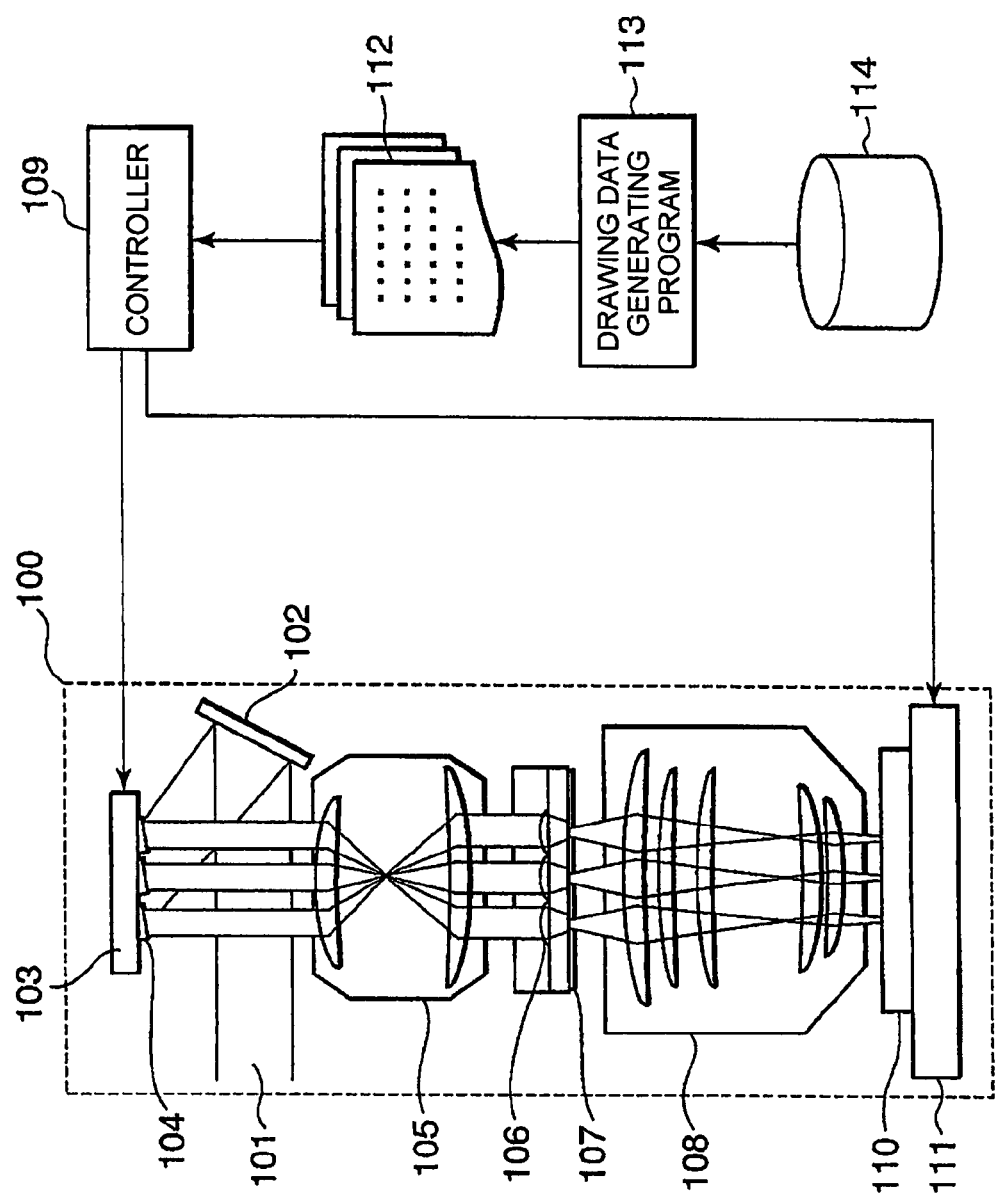
[FIG. 1] A diagram showing an example of a drawing system according to this invention.

This invention will be described in further detail.

A method of generating data according to this first invention is a method of generating, in an exposure system having a function of irradiating multigradation-controllable spotlights in a two-dimensional array onto a photosensitive film on a substrate, gradation values of the spotlights based on design graphic data. The method includes using reference data classified by features of a graphic and describing in advance combinations of gradation values mapped to coordinate information of a graphic, discriminating the feature in the design graphic data near positions of the spots, and selecting the combination of the gradation values in the reference data corresponding to coordinate information of the positions of the spots, thereby determining the gradation values.

In this data generating method, it is preferable to include, as the feature of the graphic, at least one of an area divided by one straight line, an area divided by two parallel straight lines, an area divided by two half lines having the same end point, and an undivided area.

In the foregoing data generating method, it is preferable to use, as coordinate information of a graphic, distance information of a center point of the spot from a feature position of the graphic and discrimination information as to whether or not the center point of the spot is present within the graphic, and determine, based on the distance information and the discrimination information, a feature area of the graphic to which the center point of the spot belongs.

In the foregoing data generating method, it is preferable to map two spots in an area divided by one straight line.

In the foregoing data generating method, it is preferable, in an area divided by two half lines having the same end point, to map spots located on inner and outer sides of the end point.

In the foregoing data generating method, it is preferable to map three spots in an area divided by two parallel straight lines.

In the foregoing data generating method, it is preferable to map one spot in an undivided area.

A device for generating data according to this second invention is a device for generating, in an exposure system having a function of irradiating multigradation-controllable spotlights in a two-dimensional array onto a photosensitive film on a substrate, gradation values of the spotlights based on design graphic data. The device includes a gradation value determining unit for using reference data classified by features of a graphic and describing in advance combinations of gradation values mapped to coordinate information of a graphic, and for discriminating the feature in the design graphic data near positions of the spots, and for selecting the combination of the gradation values in the reference data corresponding to coordinate information of the positions of the spots, thereby determining the gradation values.

In this data generating device, it is preferable to include, as the feature of the graphic, at least one of an area divided by one straight line, an area divided by two parallel straight lines, an area divided by two half lines having the same end point, and an undivided area.

In the foregoing data generating device, it is preferable that the gradation value determining unit includes a unit for using, as coordinate information of a graphic, distance information of a center point of the spot from a feature position of the graphic and discrimination information as to whether or not the center point of the spot is present within the graphic, and determining, based on the distance information and the discrimination information, a feature area of the graphic to which the center point of the spot belongs.

In the foregoing data generating device, it is preferable to includes a unit for mapping two spots in an area divided by one straight line.

In the foregoing data generating device, it is preferable to includes a unit for, in an area divided by two half lines having the same end point, mapping spots located on inner and outer sides of the end point.

In the foregoing data generating device, it is preferable to comprise means for mapping three spots in an area divided by two parallel straight lines.

In the foregoing data generating device, it is preferable to includes a unit for mapping one spot in an undivided area.

A program according to this third invention is a program for generating, in an exposure system having a function of irradiating multigradation-controllable spotlights in a two-dimensional array onto a photosensitive film on a substrate, gradation values of the spotlights based on design graphic data. The program includes a gradation value determining unit for using reference data classified by features of a graphic and describing in advance combinations of gradation values mapped to coordinate information of a graphic, and for discriminating the feature in the design graphic data near positions of the spots, and for selecting the combination of the gradation values in the reference data corresponding to coordinate information of the positions of the spots, thereby determining the gradation values.

In the foregoing program, it is preferable to include, as the feature of the graphic, at least one of an area divided by one straight line, an area divided by two parallel straight lines, an area divided by two half lines having the same end point, and an undivided area.

In the foregoing program, it is preferable that the gradation value determining unit includes a unit for using, as coordinate information of a graphic, distance information of a center point of the spot from a feature position of the graphic and discrimination information as to whether or not the center point of the spot is present within the graphic, and determining, based on the distance information and the discrimination information, a feature area of the graphic to which the center point of the spot belongs.

In the foregoing program, it is preferable to comprise means for mapping two spots in an area divided by one straight line.

In the foregoing program, it is preferable to includes a unit for, in an area divided by two half lines having the same end point, mapping spots located on inner and outer sides of the end point.

In the foregoing program, it is preferable to includes a unit for mapping three spots in an area divided by two parallel straight lines.

In the foregoing program, it is preferable to includes a unit for mapping one spot in an undivided area.

Further, an exposure system according to this fourth invention is an exposure system having a function of irradiating multigradation-controllable spotlights in a two-dimensional array onto a photosensitive film on a substrate. The exposure system includes a data generating unit for generating drawing data and control means for controlling irradiation positions of the spotlights and exposure of the spotlights based on the drawing data from the data generating unit. In the exposure system, the data generating unit includes any one of the foregoing data generating devices.

Embodiment

Now, an embodiment of this invention will be described with reference to the drawings.

FIG. 1 is an exemplary diagram of a system for drawing drawing data. Referring to FIG. 1, a system 100 includes a reflection optical system 102 for reflecting light 101 from a light source, a digital micromirror device 103 having micromirrors 104 for receiving and reflecting light irradiated from the reflection optical system 102, a projection optical system 105 on which reflected light from the micromirrors 104 is incident, a controller 109 for controlling reflection angles of the micromirrors 104 and further controlling a stage 111 to perform position adjustment of a substrate 110 in horizontal directions, a microlens array 106 having individual microlenses for condensing transmitted light from the projection optical system 105, a pinhole array 107 having pinholes for shaping condensed light into circles, and a reduction-projection system 108 for reducing in size the shaped light to create light spots having a diameter smaller than a light-source wavelength and irradiating the light spots onto a photosensitizer coated on the substrate 110.

Next, the operation of the system 100 will be described.

At first, the light 101 from the light source is irradiated onto the digital micromirror device 103 by the reflection optical system 102. In this example, the light of the light source is i-line (wavelength 365 nm). The light from the reflection optical system is reflected onto the projection optical system 105 by the micromirrors 104 on the digital micromirror device. In this event, the angles of the individual micromirrors are controlled by a signal from the controller 109 so that the angles of the micromirrors create a state where the light is reflected onto the projection optical system 105 and a state where the light is not reflected onto the projection optical system 105. By this, a pattern of the micromirrors on the digital micromirror device 103 is reflected onto the projection optical system 105. The projection optical system 105 is provided for the purpose of projecting the pattern on the digital micromirror device 103 onto the microlens array 106. The light reflected by the individual micromirrors and having passed through the projection optical system 105 is condensed by the individual microlenses in the microlens array 106 and shaped into circles by the individual pinholes of the pinhole array 107. The light shaped by the pinhole array 107 is reduced in size by the reduction-projection system 108, thereby creating light spots having the diameter smaller than the light-source wavelength. These light spots are irradiated onto the photosensitizer coated on the substrate 110. The substrate 110 can be moved in the directions of X-Y-θ axes (also Z-axis if optical system focus matching is required) by the stage 111.

The controller 109 uses drawing data 112 as an input to produce a pattern on the digital micromirror device 103 and to control the stage 111 to move the substrate 110 to a position corresponding to the produced pattern. Normally, the stage 111 is scanned in one direction and, at proper timings, patterns stored as drawing data 112 are sequentially displayed on the digital micromirror device 103.

The drawing data 112 is generated from design data 114 by a drawing data generating program 113. Needless to say, the drawing data generating program 113 may be installed in the form of software to be executed or a part or the whole of it may be mounted in the form of hardware.

Figure 2:
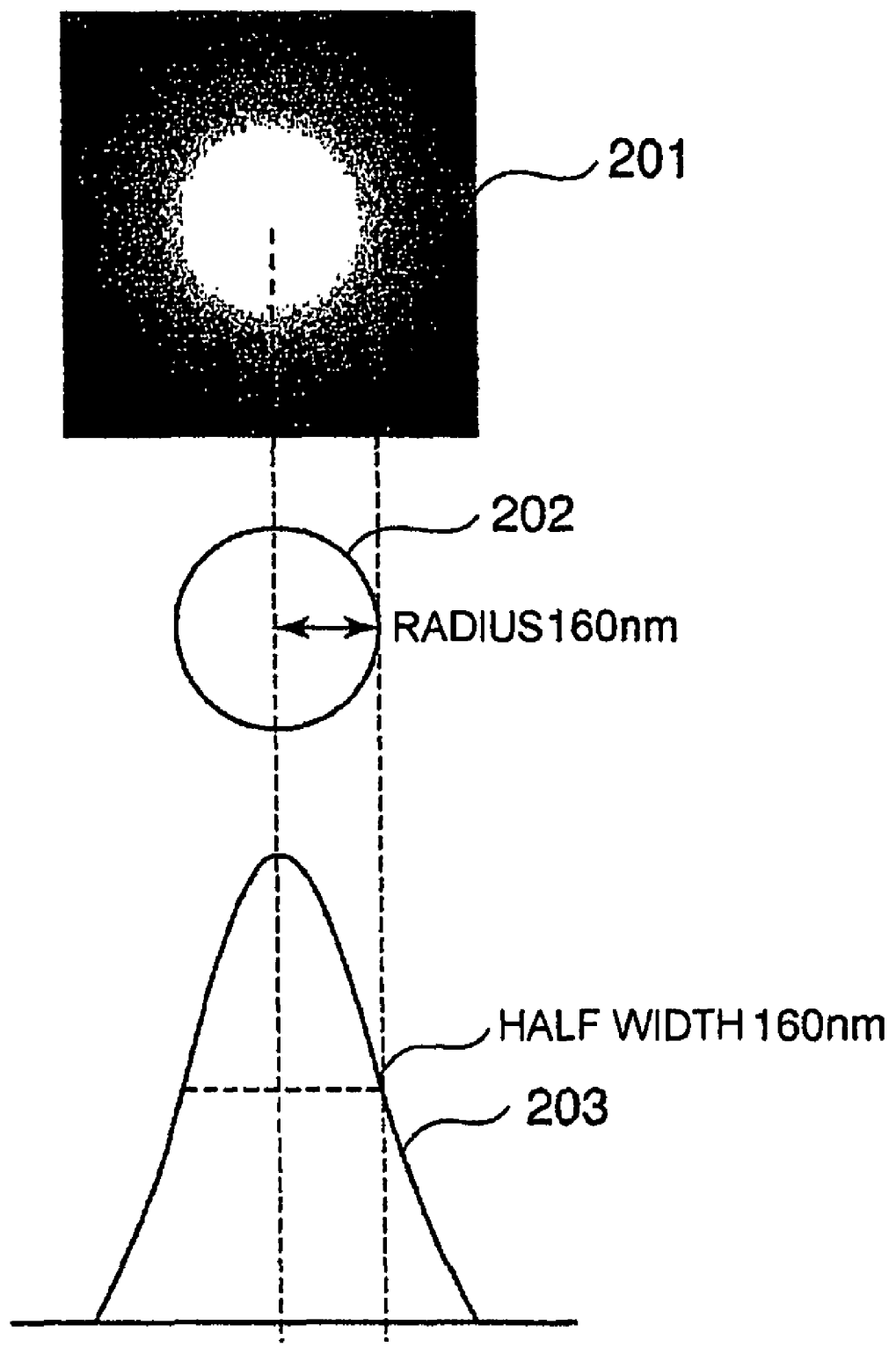
[FIG. 2] A diagram showing the shape of a spotlight irradiated onto a substrate.

FIG. 2 is a diagram explaining the shape of a spotlight irradiated onto a substrate. Referring to FIG. 2, as shown in the uppermost photograph, a spotlight 201 on the substrate can be regarded, if exemplarily drawn, as a circular shape having a radius of 160 nm like 202. However, since this spotlight is smaller than the wavelength of the light source (herein, 365 nm of i-line), it inevitably has a light amount distribution like 203. In this embodiment, a drawing system design is carried out so that a half width of the light amount distribution becomes 160 nm, and thus the spotlight is exemplarily expressed like 202.

Figure 3:
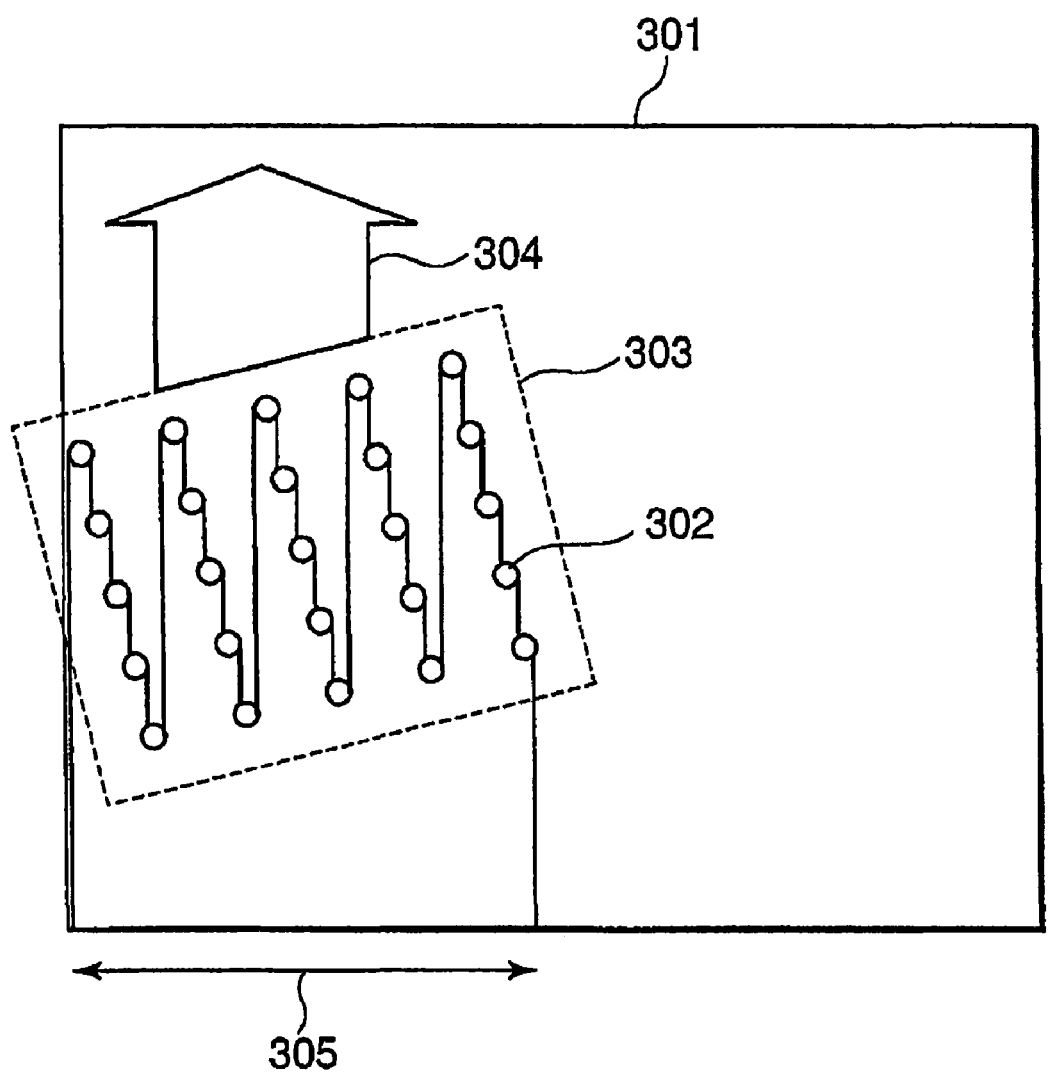
[FIG. 3] A diagram showing a drawing method using spotlights.

FIG. 3 is a diagram showing a drawing method using spotlights according to an example of this invention. Spotlights 302 are irradiated onto a substrate in a drawing area 301 in an array corresponding to an array manner of the micromirrors arranged on the digital mirror device as indicated by reference numeral 303. In this example, it is assumed that the micromirrors of the digital mirror device each have a size of 13 μm square and are arranged in a 1024×768 micromirror array. In this case, drawing is carried out while scanning the stage in a direction inclined at about 3 degrees with respect to an arrangement direction 303 of the spotlights from the digital mirror device. If this is seen from the array of the spotlights, it moves in the drawing area 301 in a direction indicated by an arrow 304. While performing the movement in this manner, a pattern on the digital mirror device is irradiated each time the spotlights move the half width (160 nm). By this, it becomes possible to irradiate spotlights in a 160 nm-interval mesh-like manner in a drawing area having a scan width 305 (about 3 mm in this example). Further, since a plurality of (40 in this example) spotlights pass through each of the positions where spotlights are irradiated, it becomes possible to control the light amount of spotlight in 40 levels (40 gradations).

Figure 4:
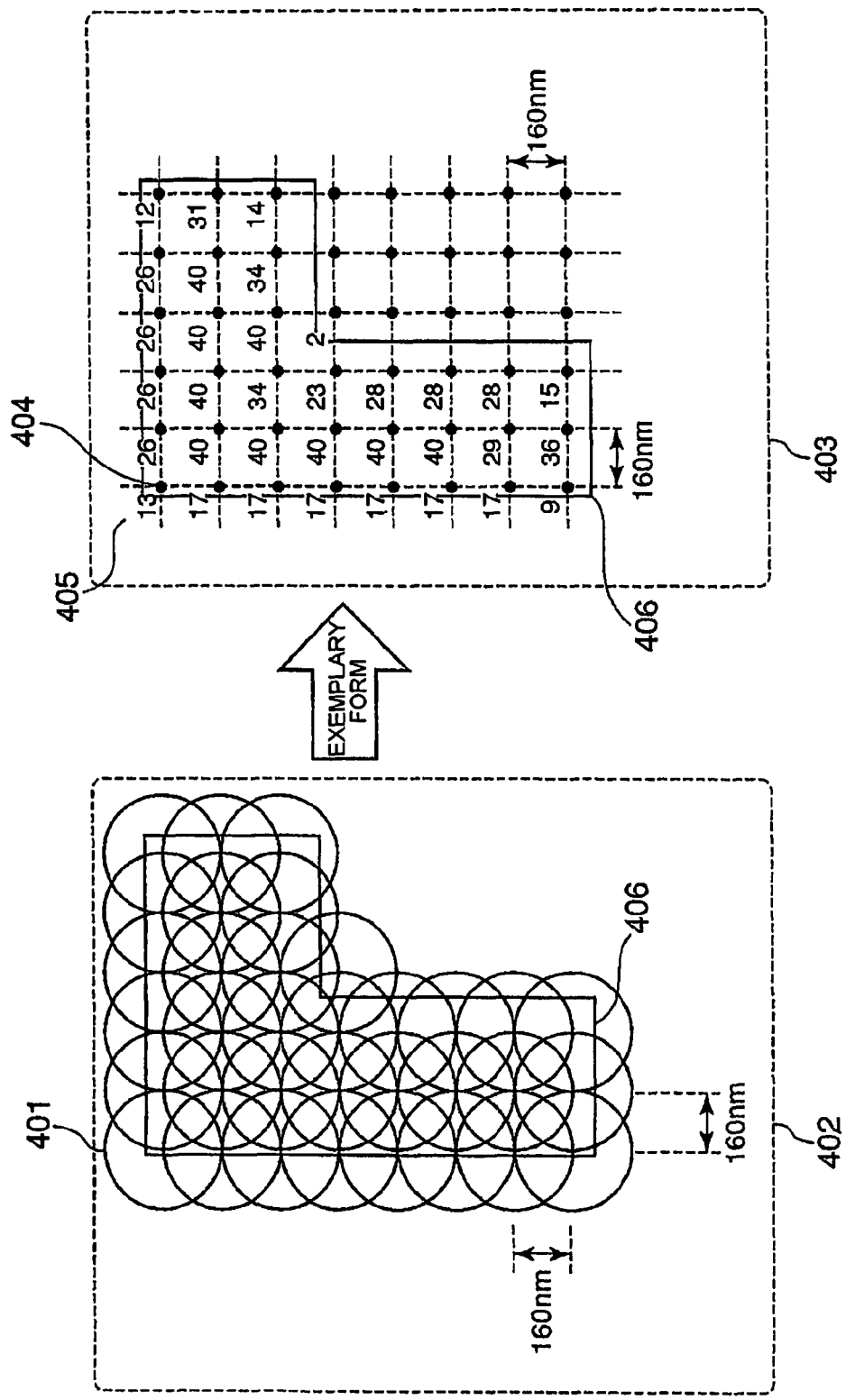
[FIG. 4] A diagram showing pattern drawing with spotlights irradiated in a mesh-like manner.

FIG. 4 is a diagram for explaining pattern drawing carried out using spotlights irradiated in a mesh-like manner. As shown in FIG. 4, an exemplary diagram 401 of grid lights expressed by circles shows an exemplary form of a light amount distribution caused by 40 spotlights irradiated at each of positions in a drawing area. In the drawing area, circular spotlights each having 40 gradations as described above overlap each other with an offset of the half width (160 nm) in longitudinal and transverse directions like 402. A pattern formed by this spotlight array is determined by gradation values and overlaps of the respective spotlights. An exemplary form of the relationship between the spotlight array and the gradation values of the spotlights is shown at 403 for facilitating understanding thereof. The center position of each spotlight is given as indicated by reference numeral 404 and the gradation value is given on the upper left as indicated by reference numeral 405. A desired pattern 406 to be formed becomes like 403 if drawn on the spot array with an accuracy of 4 nm. It is assumed that the gradation values of the spotlights for forming such a desired pattern 406 have, for example, a distribution as indicated by reference numeral 403. Note that no value is given in the case of a spotlight having a gradation value of 0. A drawing data generating method of this invention is a method of generating the spotlight gradation value array as indicated by reference numeral 403, i.e. drawing data, from the desired pattern as indicated by reference numeral 406.

Hereinbelow, a description will be given of a data generating method being the operation of gradation value determining means of a data generating device according to an example of this invention.

Figure 5:
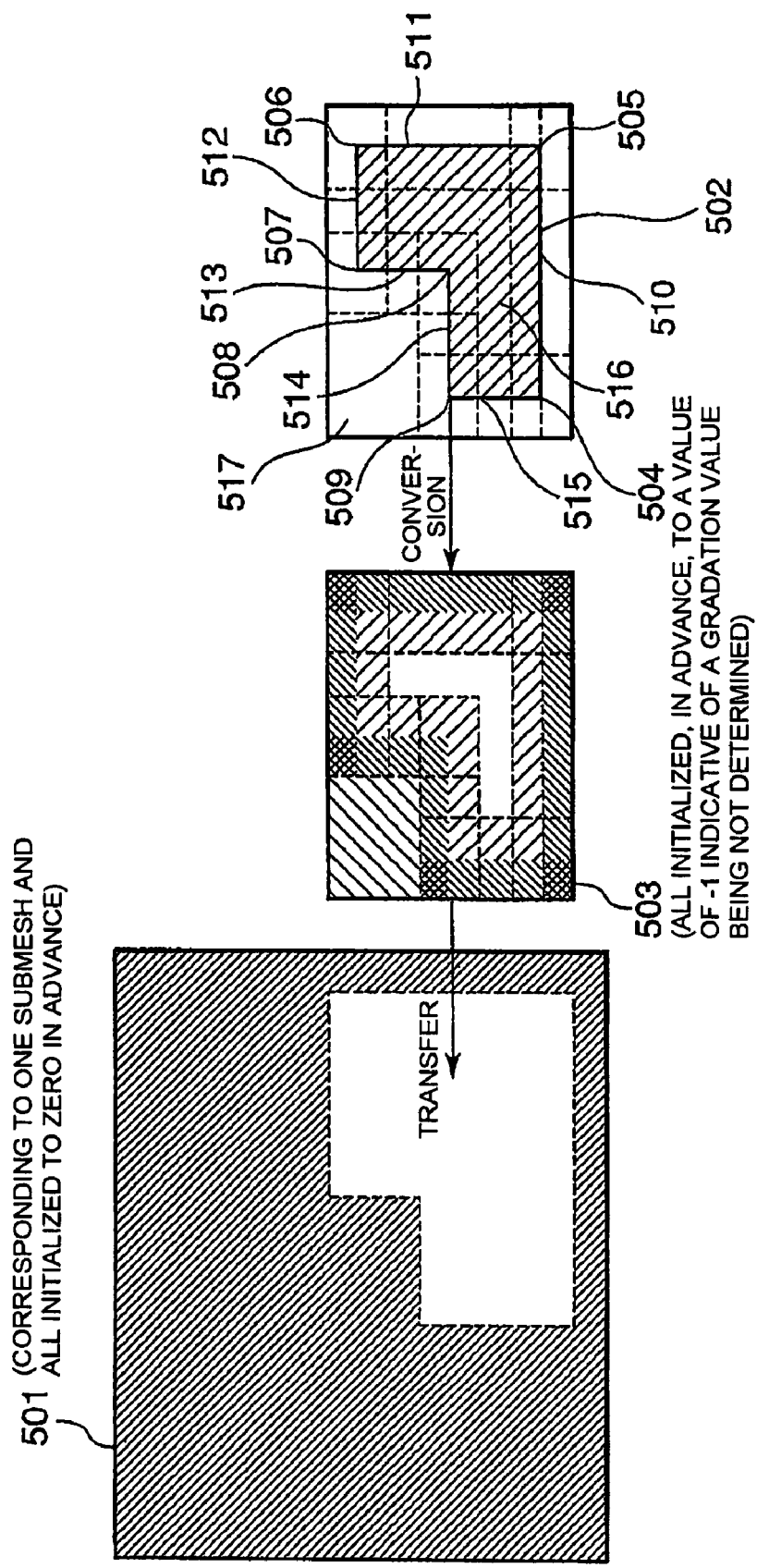
[FIG. 5] A diagram showing an example of a method of generating data according to this invention.

FIG. 5 is an exemplary diagram showing the example of the data generating method of this invention. Referring to FIG. 5, a design graphic data plane is divided into rectangles arranged in a two-dimensional array, wherein each rectangle is called a submesh and conversion is carried out per submesh. Gradation value storage areas 501 each for storing gradation values of one submesh are initialized to a gradation value of 0 in advance, then store conversion results, and finally output them. Graphic data 502 necessary for determining gradation values in a certain submesh is sequentially read, the conversion results are written into a gradation value temporary storage area 503, and only the necessary portions are transferred to the gradation value storage area 501. In this example, it is assumed that all graphics are spaced apart from each other by a distance 6 times or more a distance between the centers of spotlights. The read graphic data 502 is divided into corners 504 to 509, sides 510 to 515, and the other portions 516 and 517 and, at first, the corners 504 to 509 and the side portions 510 to 515 are converted. It is assumed that each graphic is comprised of segments, each segment has a length 6 times or more the distance between the centers of the spotlights, and further, a portion having a width less than 6 times the distance between the centers of the spotlights is regarded as non-existing with respect to each graphic. At the time of this conversion, an identifier indicating the outside of graphic is written into the gradation value temporary storage area at portions corresponding to spotlights located one-spotlight outside spotlights whose gradation values have been determined. Thereafter, in the portions 516 and 517 whose gradation values are not determined, gradation values of the portion 516 surrounded by the proper gradation values are set to a maximum value. Thereafter, the gradation values in the gradation value temporary storage area, except at the portions where the identifier indicating the outside of graphic is written and at the portion 517 which is surrounded thereby and whose gradation values are not determined, are transferred to the gradation value storage area.

Figure 6:
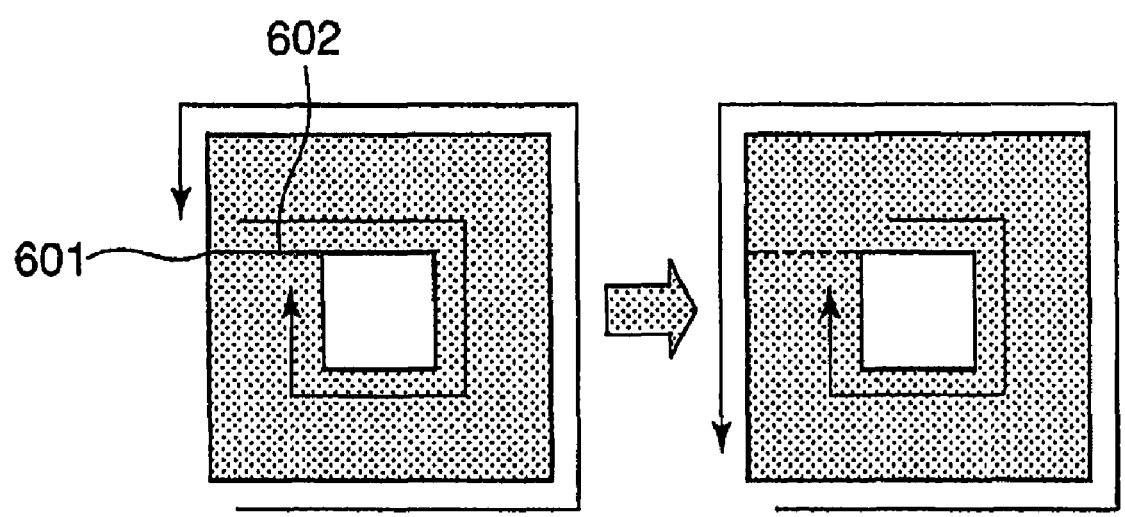
[FIG. 6] A diagram showing a state of removing an extra segment on data according to this invention.

FIG. 6 is a diagram showing a state of removing an extra segment on data. As shown in FIG. 6, graphic data is expressed by arrangement of vertex coordinates, wherein the vertex coordinates are arranged so as to trace sides and, further, so as to cause the left side to be the inner side in tracing the sides. However, in the case of a graphic having a vacant space, an extra vertex 601 and an extra segment 602 are added for arranging vertex coordinates. Since these vertex 601 and segment 602 impede discrimination of a feature of the graphic, an element indicating a vertex whose arrangement order is immediately before and an element indicating a vertex whose arrangement order is immediately after are added as graphic data in addition to vertex coordinates thereof, thereby performing conversion into graphic data not including the extra vertex 601 and the extra segment 602.

Figure 7:
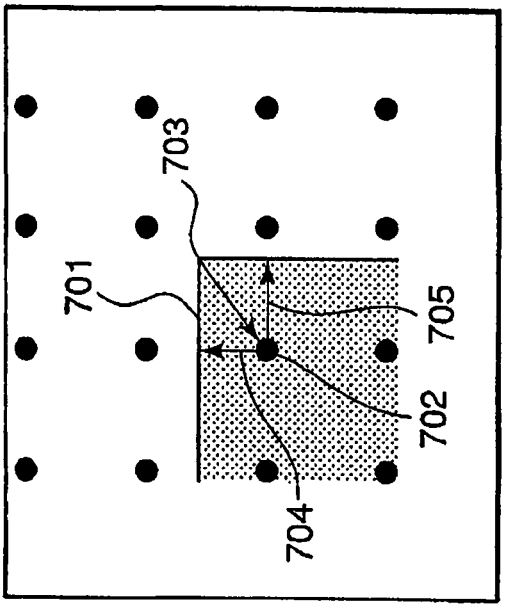
[FIGS. 7(a)-7(d)] Are diagrams showing examples of parameter calculation methods according to this invention.
Figure 7:
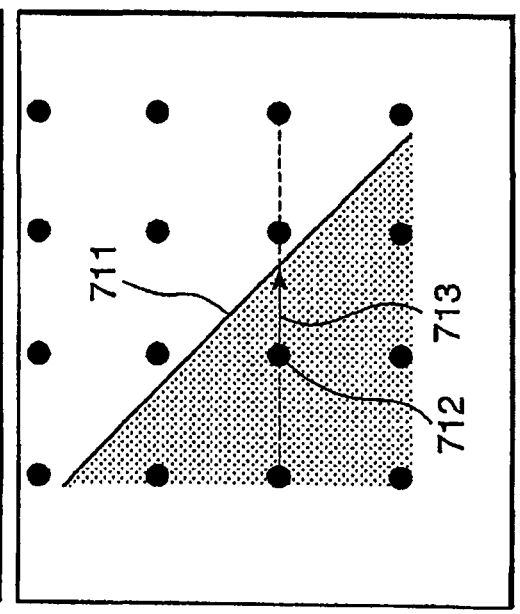
Figure 7:
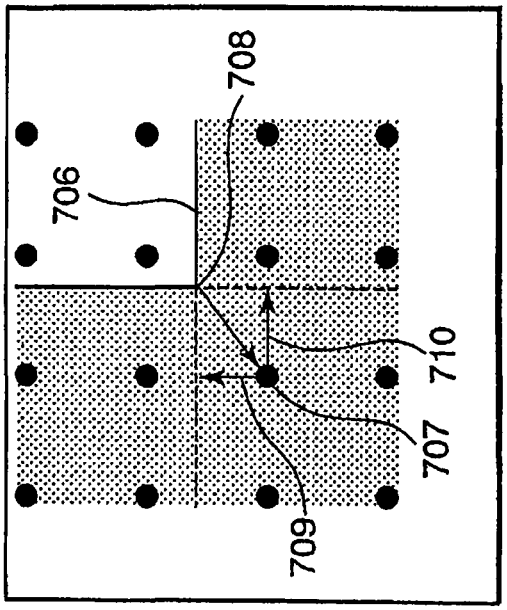
Figure 7:
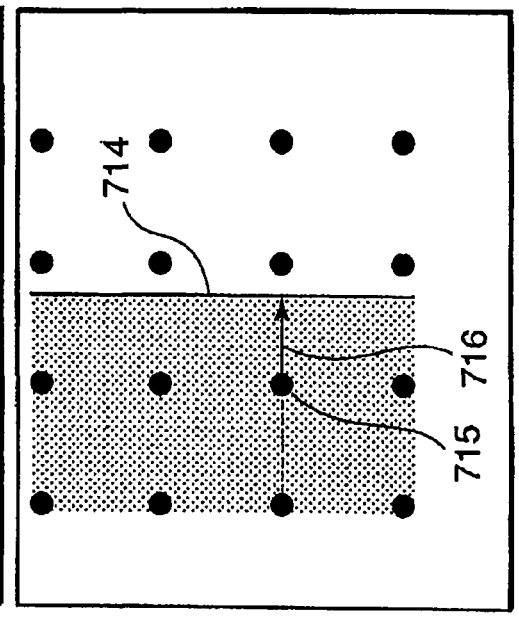
Figure 8:
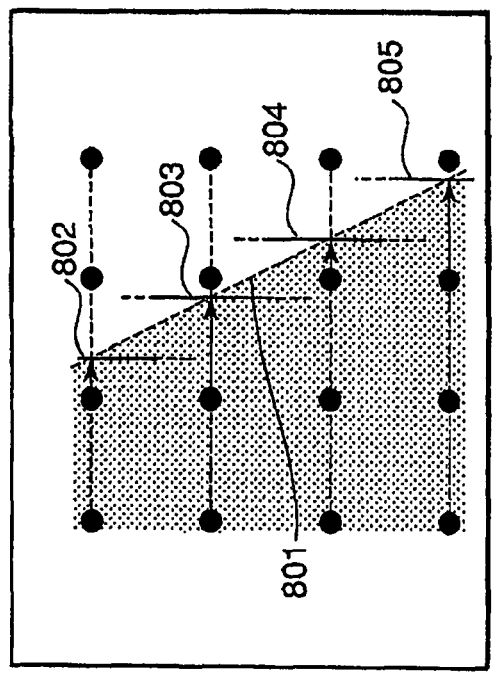
[FIGS. 8(a)-8(c)] Are diagrams showing other examples of parameter calculation methods according to this invention.
Figure 8:
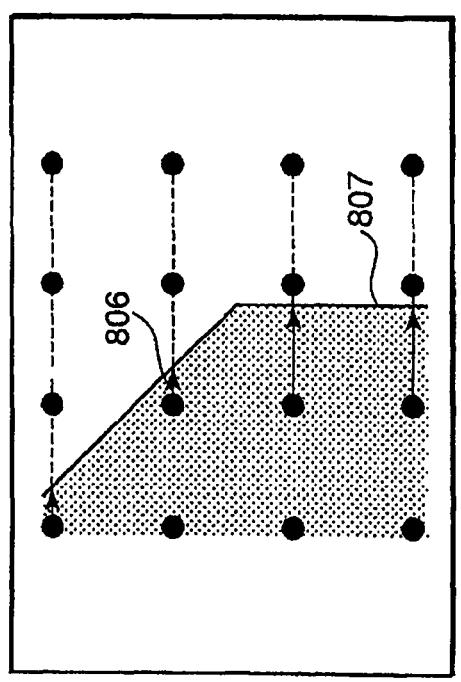
Figure 8:
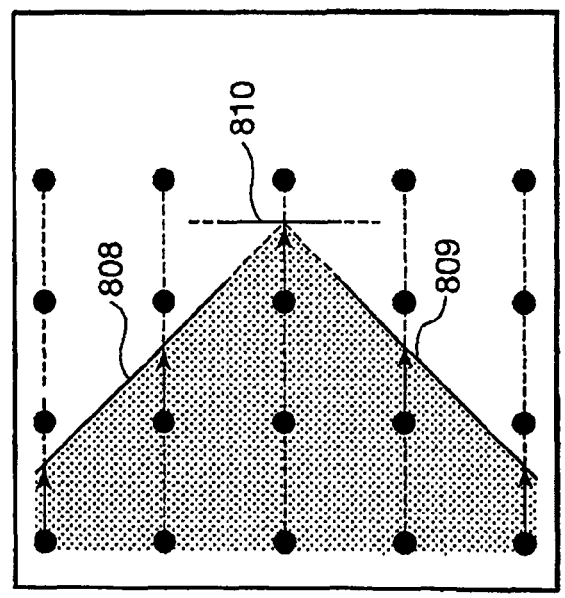

FIGS. 7 and 8 are exemplary diagrams showing methods of calculating parameters when selecting combinations of gradation values by reference data corresponding to features of graphics, respectively. In subsequent figures, black circles arranged in a two-dimensional array represent the center positions of respective spots.

As shown in FIG. 7, (a), in the case of a convex-type corner 701, a graphic is rotated so that the lower left becomes the inner side, then coordinates of a spot center 702 nearest on the inner side are calculated, thereby using a horizontal displacement 704 and a vertical displacement 705 from the spot center 702 to a vertex 703 as parameters.

As shown in FIG. 7, (b), in the case of a concave-type corner 706, a graphic is rotated so that the lower left becomes the inner side, then coordinates of a spot center 707 nearest on the lower left are calculated, thereby using a horizontal displacement 709 and a vertical displacement 710 from the spot center 707 to a vertex 708 as parameters.

As shown in FIG. 7, (c), in the case of a side 711 having an inclination of 45° with respect to a grid line, coordinates of a spot center 712 nearest on the inner side are calculated, thereby using a horizontal displacement 713 from the spot center 712 to the side 711 as a parameter.

As shown in FIG. 7, (d), in the case of a side 714 parallel to a grid line, a graphic is rotated so that the left side becomes the inner side, then coordinates of a spot center 715 nearest on the inner side are calculated, thereby using a horizontal displacement 716 from the spot center 715 to the side 714 as a parameter.

A feature of a graphic other than the convex-type corner 701, the concave-type corner 706, the side 711 with the inclination of 45° with respect to the grid line, and the side 714 parallel to the grid line shown in FIG. 7, (a) to (d) is approximated by the convex-type corner 701, the concave-type corner 706, the side 711 with the inclination of 45° with respect to the grid line, or the side 714 parallel to the grid line.

As shown in FIG. 8, (a), a side 801 not parallel to a grid line and having an inclination of other than 45° with respect to the grid line is approximated by a combination of small segments 802 to 805 parallel to the grid line.

As shown in FIG. 8, (b), a feature 806-807 having a corner other than the convex-type corner 701 and the concave-type corner 706 and crossing grid lines at sides thereof is approximated by a combination of the sides 806-807.

As shown in FIG. 8, (c), a feature 808-809 having a corner other than the convex-type corner 701 and the concave-type corner 706 and crossing a grid line at a vertex thereof is approximated by a combination of sides 808-809 and, in addition, the vertex portion is approximated by a side 810 parallel to a grid line.

Figure 9:
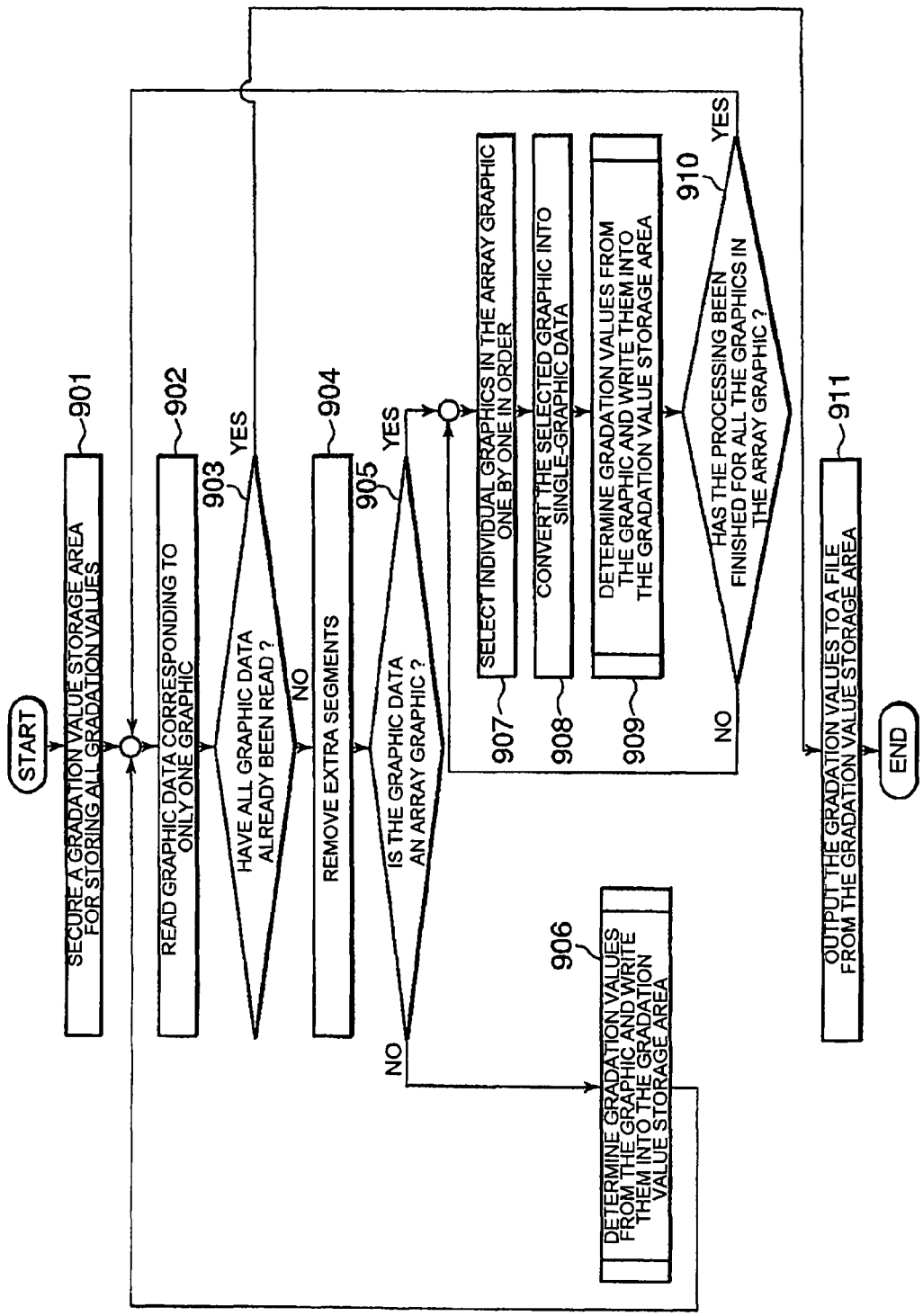
[FIG. 9] A diagram showing a flowchart of a method of generating data according to this invention.

FIG. 9 is a flowchart showing a data generating method. As shown in FIG. 9, first in step 901, a gradation value storage area for storing all gradation values is secured and all gradation values in the gradation value storage area are initialized to a gradation value mapped to an undivided non-irradiation portion. Then, step 902 attempts to read graphic data corresponding to only one graphic. Then, through step 903, if the graphic data is read in step 902, the operation proceeds to step 904, while, if the graphic data is not read because all the graphic data have already been read, the operation proceeds to step 911. Step 904 removes extra information in the graphic data and extracts only a contour line. Then, step 905 checks whether or not the graphic data is an array graphic in which graphics are arranged in a two-dimensional array. If it is the array graphic, the operation proceeds to step 907, while, if it is not the array graphic but is a single graphic, the operation proceeds to step 906. Step 906 determines gradation values of spots at respective positions according to the graphic data and writes them into the gradation value storage area. Details of step 906 will be described with reference to FIG. 10.

Step 907 selects the individual graphics arranged in the two-dimensional array one by one in order. Then, step 908 converts the selected individual graphic into single-graphic data. Then, step 909 determines gradation values from the single-graphic data using the same sequence as that in step 906 and writes them into the gradation value storage area. Then, step 910 judges whether or not the processing has been finished for all the graphics in the array graphic. If the processing has been finished, the operation returns to step 902, while, if the processing has not yet been finished, the operation returns to step 907. Step 911 outputs the determined gradation values to a file from the gradation value storage area.

Figure 10:
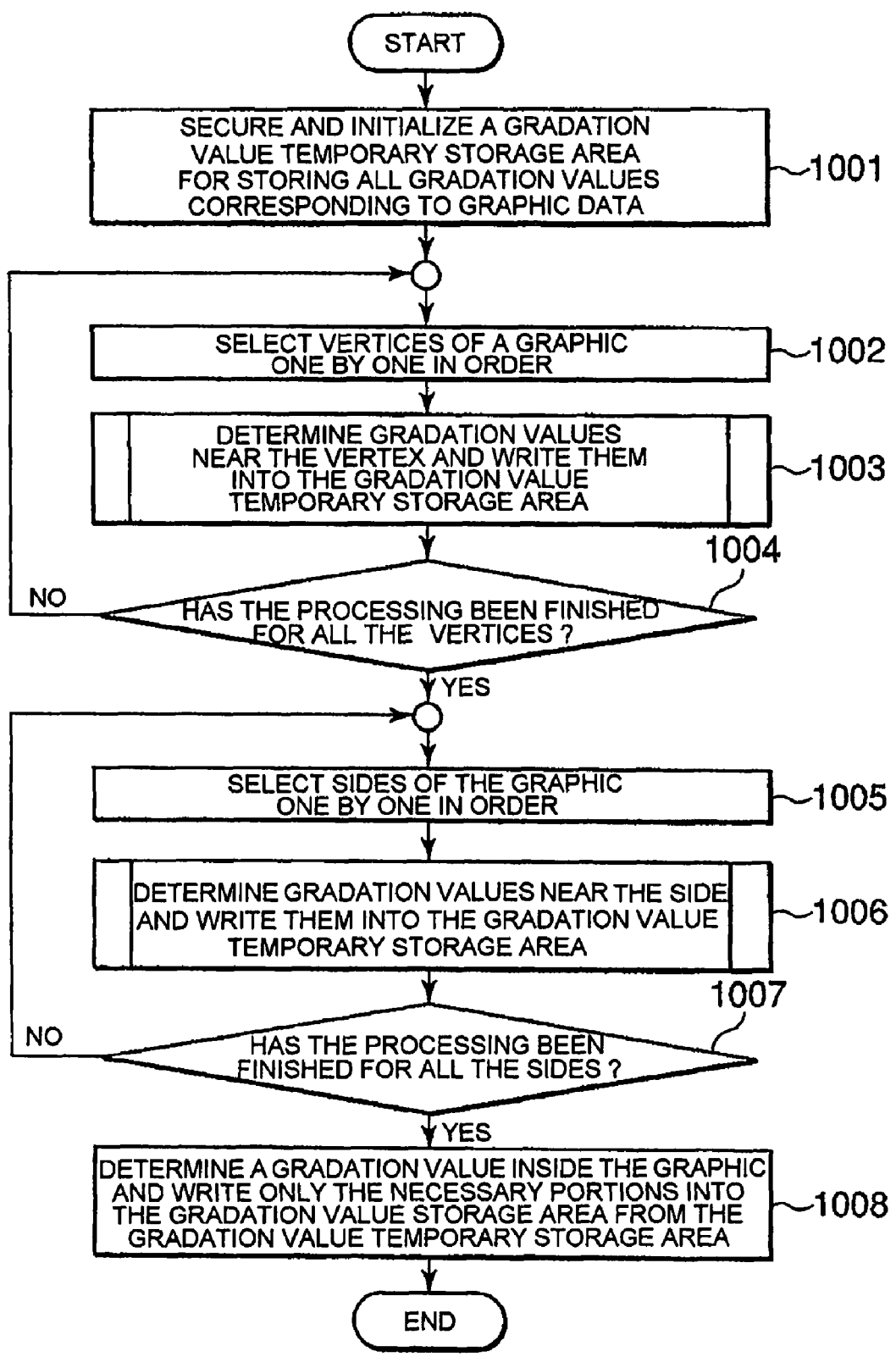
[FIG. 10] A diagram showing a method of determining gradation values from single-graphic data according to this invention.

FIG. 10 is a flowchart showing a method of determining gradation values from single-graphic data. Referring to FIG. 10, first in step 1001, a gradation value temporary storage area for storing all gradation values determined by graphic data is secured and all gradation values in the gradation value temporary storage area are temporarily initialized with an identifier indicating that a gradation value has not yet been determined. Then, step 1002 selects vertices of a graphic one by one in order. Then, step 1003 determines gradation values of spots near the selected vertex and writes them into the gradation value temporary storage area and, simultaneously, temporarily writes an identifier indicating the outside of graphic into the gradation value temporary storage area at portions corresponding to spots located on the one-spot outside. Details of step 1003 will be described with reference to FIG. 11. Then, step 1004 judges whether or not the processing has been finished for all the vertices. If finished, the operation proceeds to step 1005, while, if not finished, the operation returns to step 1002. Step 1005 selects sides of the graphic one by one in order. Then, step 1006 determines gradation values of spots near the selected side and writes them into the gradation value temporary storage area and, simultaneously, temporarily writes the identifier indicating the outside of graphic into the gradation value temporary storage area at portions corresponding to spots located on the one-spot outside. Then, step 1007 judges whether or not the processing has been finished for all the sides. If finished, the operation proceeds to step 1008, while, if not finished, the operation returns to step 1005. In Step 1008, in those portions whose gradation values have not yet been determined in the gradation value temporary storage area, gradation values of the portion surrounded by the effective gradation values are converted to a gradation value mapped to an undivided irradiation portion, then the portions where the effective gradation values are written in the gradation value temporary storage area are copied into the gradation value storage area.

Figure 11:
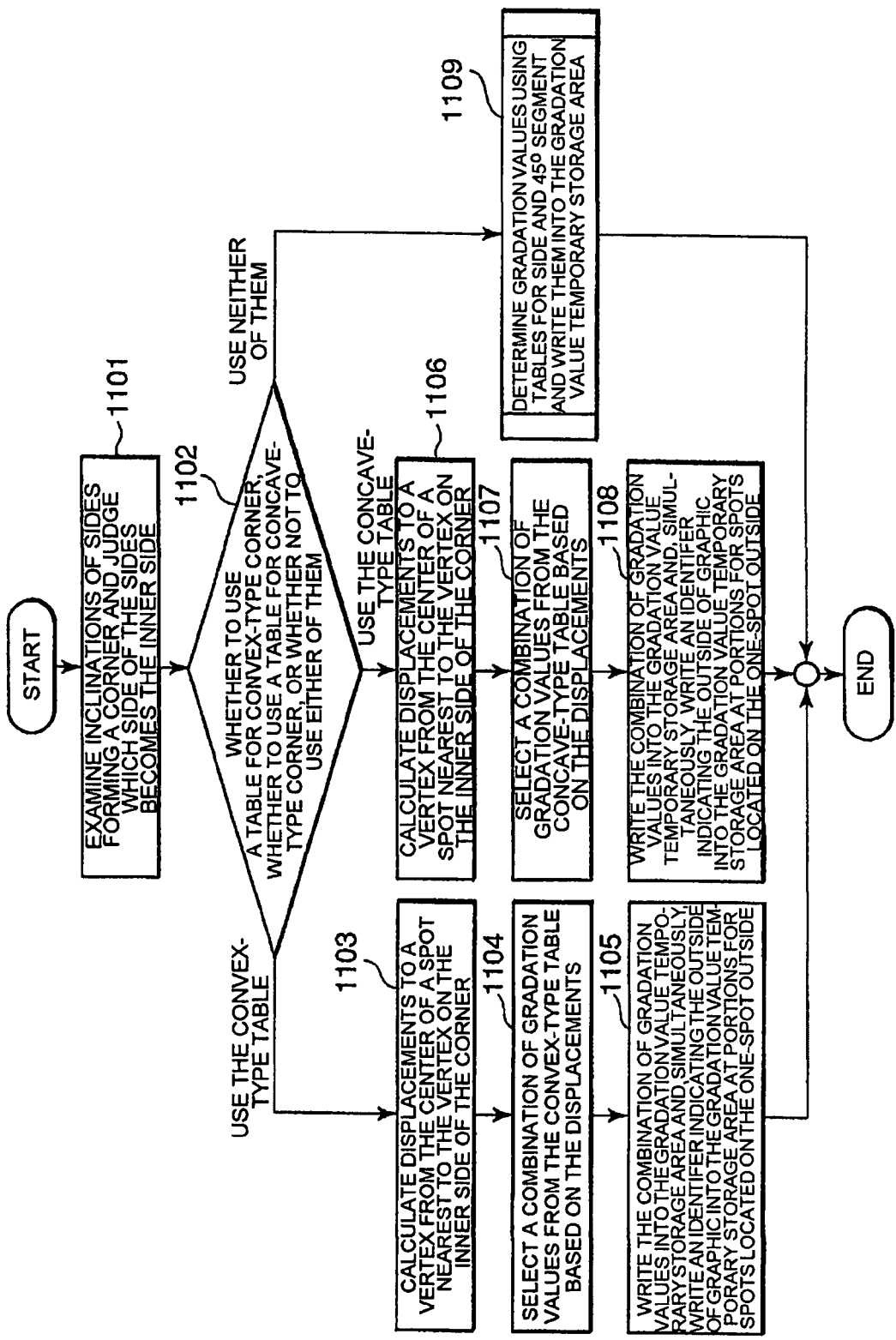
[FIG. 11] A diagram showing a method of determining gradation values near a vertex and writing them into a gradation value temporary storage area according to this invention.

FIG. 11 is a flowchart showing a method of determining gradation values near a vertex and writing them into the gradation value temporary storage area. Referring to FIG. 11, first in step 1101, inclinations of two sides forming a corner are examined based on coordinates of a vertex corresponding to the corner and coordinates of vertices immediately after and immediately before such a vertex on graphic data and it is judged which side of the sides becomes the inner side based on elements representing the vertices immediately after and immediately before the vertex corresponding to the corner on the graphic data.

Then, step 1102 judges based on results of the examination whether to use a table for convex-type corner, whether to use a table for concave-type corner, or whether to perform an approximation using a table for side without using either of them. If the table for convex-type corner is used, the operation proceeds to step 1103. If the table for concave-type corner is used, the operation proceeds to step 1106. If the approximation is performed using the table for side without using either of them, the operation proceeds to step 1109. Step 1103 calculates center coordinates of a spot nearest to the vertex on the inner side of the corner, thereby calculating horizontal and vertical displacements from the center of the spot to the vertex.

Then, step 1104 selects a combination of gradation values from the convex-type table based on the displacements calculated in step 1103. Then, step 1105 writes the combination pattern of gradation values selected in step 1104 into the gradation value temporary storage area and, simultaneously, temporarily writes the identifier indicating the outside of graphic into the gradation value temporary storage area at portions that store gradation values of spots located one-spot outside the portion where such a pattern is written. Step 1106 calculates center coordinates of a spot nearest to the vertex on the inner side of the corner, thereby calculating horizontal and vertical displacements from the center of the spot to the vertex.

Then, step 1107 selects a combination of gradation values from the concave-type table based on the displacements calculated in step 1106. Then, step 1108 writes the combination pattern of gradation values selected in step 1107 into the gradation value temporary storage area and, simultaneously, temporarily writes the identifier indicating the outside of graphic into the gradation value temporary storage area at portions that store gradation values of spots located one-spot outside the portion where such a pattern is written. Step 1109 determines gradation values near the vertex using tables for side and 45° segment. Details of step 1109 will be described with reference to FIGS. 12 and 13.

Figure 12:
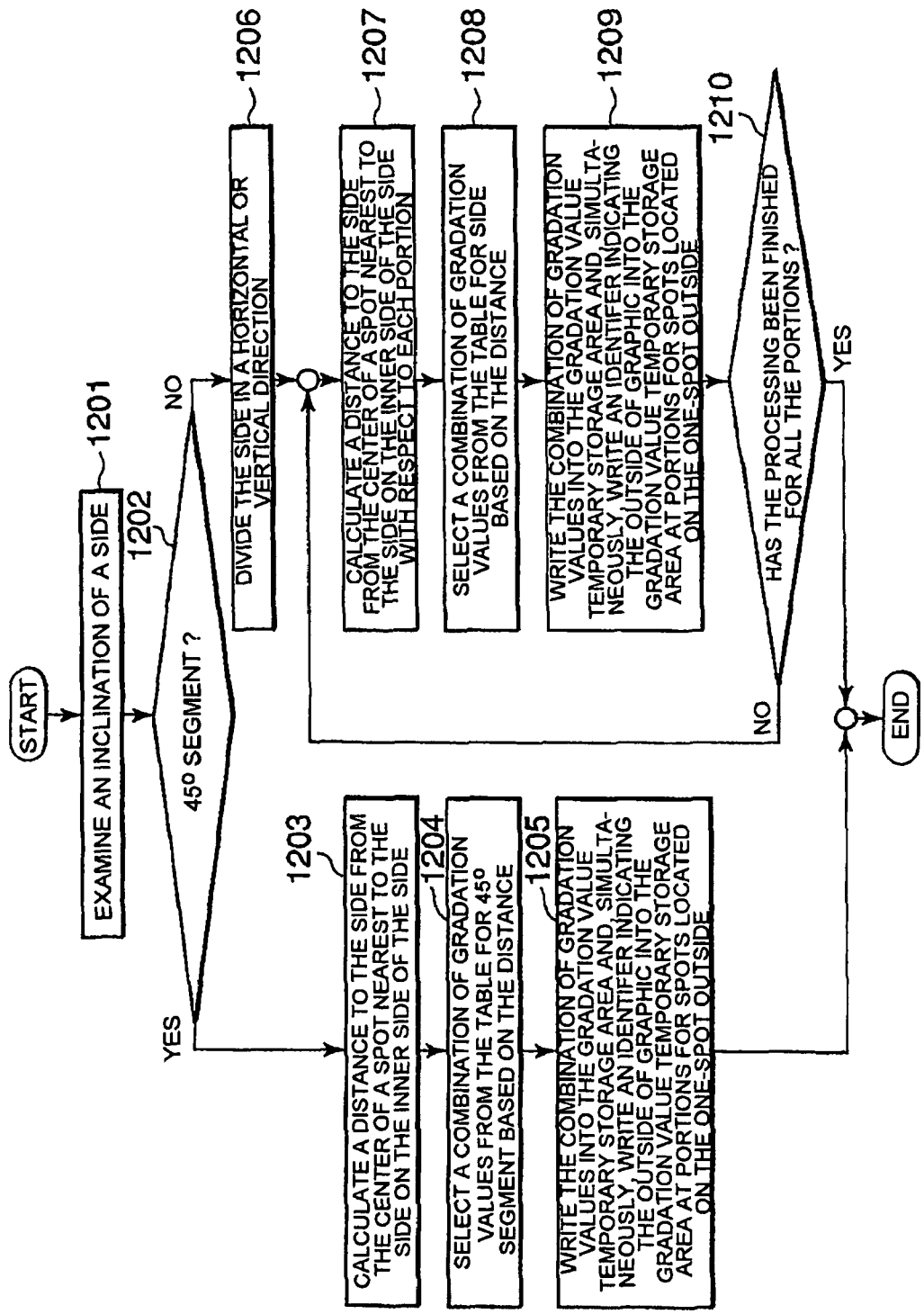
[FIG. 12] A diagram showing a method of determining gradation values near a side and writing them into the gradation value temporary storage area according to this invention.

FIG. 12 is a flowchart showing a method of determining gradation values near a side and writing them into the gradation value temporary storage area. Referring to FIG. 12, first in step 1201, an inclination of a side is examined. Then, step 1202 judges whether or not the side forms an inclination of 45° with respect to a grid line. If it forms the inclination of 45°, the operation proceeds to step 1203, while, if it does not form the inclination of 45°, the operation proceeds to step 1206. Step 1203 calculates center coordinates of a spot nearest to the side on the inner side of the side, thereby calculating a horizontal displacement from the center of the spot to the side. Then, step 1204 selects a combination of gradation values from the table for 45° segment based on the displacement calculated in step 1203.

Then, step 1205 writes the combination pattern of gradation values selected in step 1204 into the gradation value temporary storage area and, simultaneously, temporarily writes the identifier indicating the outside of graphic into the gradation value temporary storage area at portions that store gradation values of spots located one-spot outside the portion where such a pattern is written. Step 1206 divides the side per vertical spot row to get ready for subsequent processing if the side is horizontal to the coordinate axis, while, divides the side per horizontal spot row to get ready for subsequent processing if the side is vertical to the coordinate axis.

Then, step 1207 calculates, per portion divided in step 1206, center coordinates of a spot nearest to the side on the inner side of the side, thereby calculating a horizontal or vertical displacement from the center of the spot to the side. Then, step 1208 selects a combination of gradation values from the table for side based on the displacement. Then, step 1209 writes the combination pattern of gradation values selected in step 1208 into the gradation value temporary storage area and, simultaneously, temporarily writes the identifier indicating the outside of graphic into the gradation value temporary storage area at portions that store gradation values of spots located one-spot outside the portion where such a pattern is written.

Then, step 1210 judges whether or not the processing of steps 1207 to 1209 has been finished for all the portions divided in step 1206. If there remains any portion for which the processing of steps 1207 to 1209 has not yet been finished, the operation returns to step 1207, while, if the processing of steps 1207 to 1209 has been finished for all the portions, the operation is ended.

Figure 13:
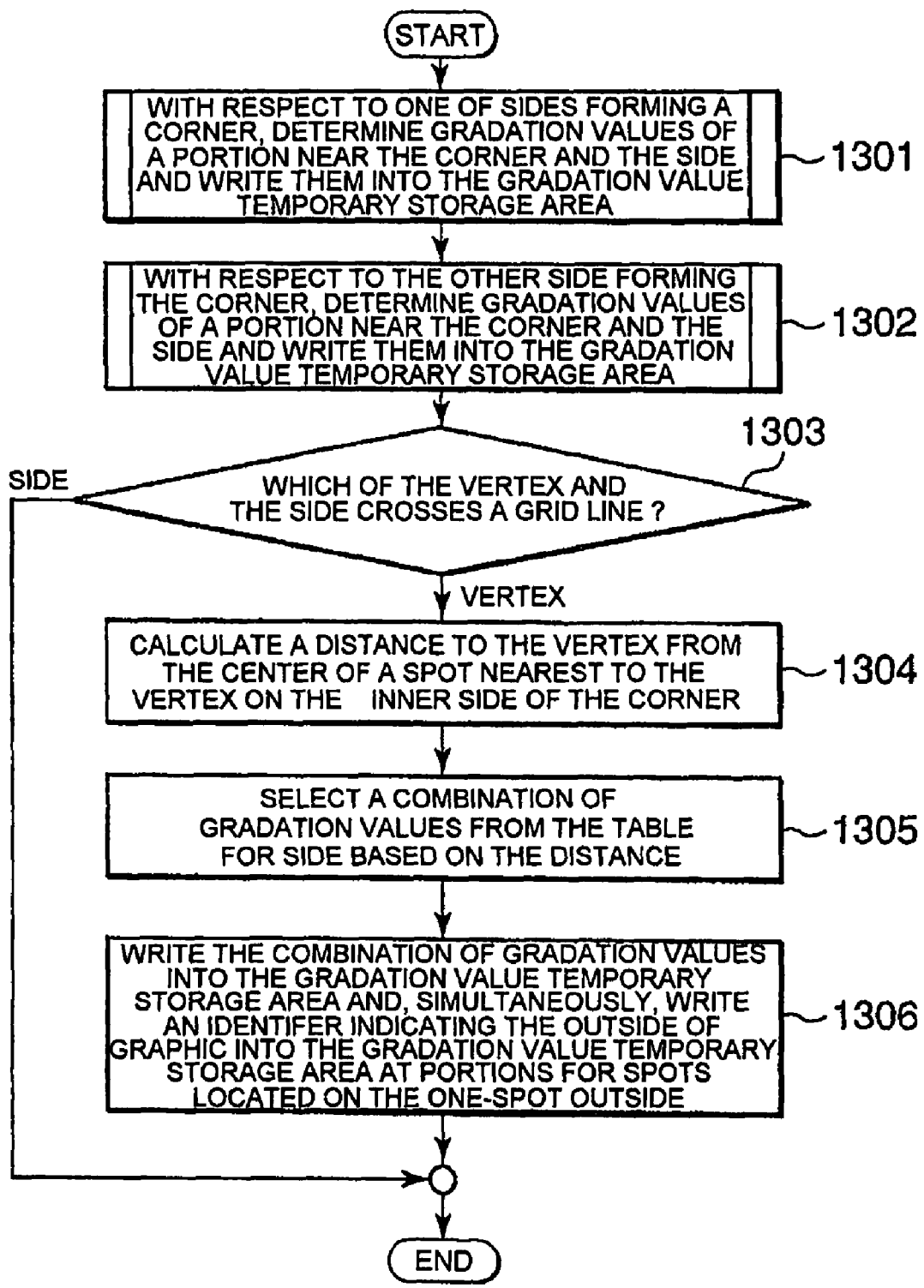
[FIG. 13] A diagram showing a method of determining gradation values near a vertex and writing them into the gradation value temporary storage area according to this invention.

FIG. 13 is a flowchart showing a method of determining gradation values near a vertex using the tables for side and 45° segment and writing them into the gradation value temporary storage area. Referring to FIG. 13, first in step 1301, with respect to one of sides forming a corner, gradation values of a portion near the corner and the side are determined and written into the gradation value temporary storage area. Details are the same as in FIG. 12 except that the portion of which the gradation values are determined and which is written into the gradation value temporary storage area is limited to near the corner. Then, with respect to the other side forming the corner, step 1302 determines gradation values of a portion near the corner and the side and writes them into the gradation value temporary storage area using the same sequence as in step 1301. Then, step 1303 judges which of the vertex and the side crosses a grid line. If the vertex portion crosses the grid line, the operation proceeds to step 1304, while, if the side portion crosses the grid line, the operation is ended. Step 1304 calculates center coordinates of a spot nearest to the vertex on the inner side of the corner, thereby calculating a distance from the center of the spot to the vertex. Then, step 1305 selects a combination of gradation values from the table for side based on the distance. Then, step 1306 writes the combination pattern of gradation values selected in step 1305 into the gradation value temporary storage area and, simultaneously, temporarily writes the identifier indicating the outside of graphic into the gradation value temporary storage area at portions that store gradation values of spots located one-spot outside the portion where such a pattern is written.

Figure 14:
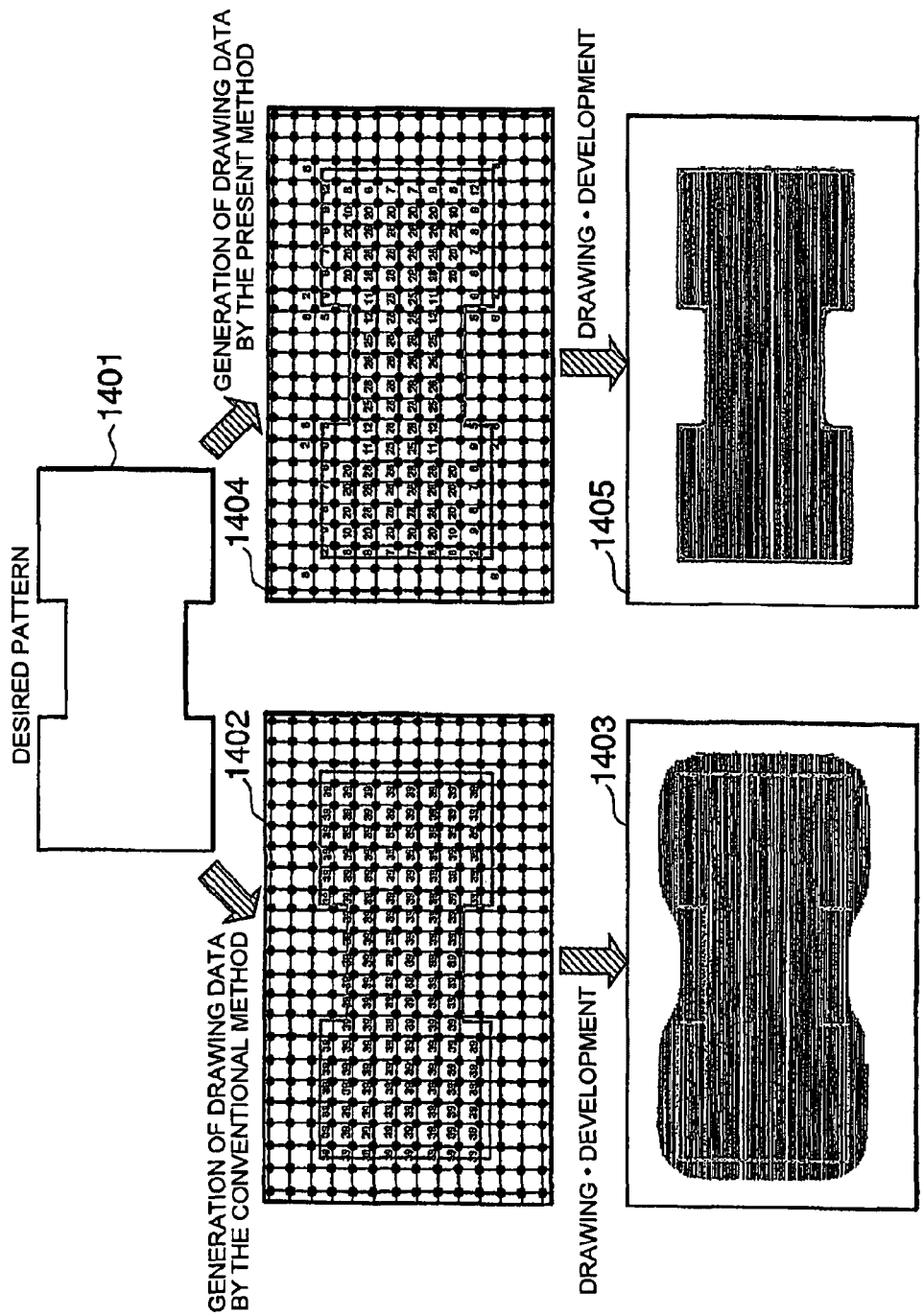
[FIG. 14] A diagram comparing drawing data generated by the conventional method and the method of this invention and patterns obtained therefrom.

FIG. 14 compares drawing data generated by the method of this invention with that generated by the conventional method. Referring to FIG. 14, if a desired pattern is shown as indicated by reference numeral 1401, the drawing data generated by the conventional method has a gradation value array as indicated by reference numeral 1402. Each spotlight has 40 gradations. According to the conventional method, spots located within a pattern have a maximum gradation value of 39 and the others have a minimum gradation value of 0. Herein, no value is indicated for the spots with the value of 0. When drawing and development are carried out using this drawing data, there is obtained a pattern of a black-colored portion as indicated by reference numeral 1403. It is seen that there is large deviation from the desired pattern indicated with a gray line. On the other hand, the drawing data generated by the present method has a gradation value array as indicated by reference numeral 1404. When drawing and development are carried out using this drawing data, there is obtained a pattern of a black-colored portion as indicated by reference numeral 1405. It is seen that the deviation from the desired pattern indicated with the gray line is improved as compared with the conventional method. Further, according to the present method, even an edge of a pattern existing between a spot and a spot can be drawn with a position control of 1 to 4 nm, which is impossible by the conventional method.

INDUSTRIAL APPLICABILITY

This invention is typically software for generating drawing data in a drawing system adapted to fabricate a photomask for manufacturing semiconductor integrated circuits. However, this invention is not limited to the photomask fabrication and is also applicable to patterning systems for semiconductor integrated circuits, microelectronic devices, micro-optical devices, and display devices.

The invention claimed is:

1. A method of generating gradation values of intensities due to duplication of spotlights based on design graphic data for use in an exposure system including a digital micromirror device provided for irradiating multigradation-controllable spotlights in a two-dimensional array onto a photosensitive film on a substrate in a patterning process, said method comprises the steps of:
   storing reference data classified by the feature of a graphic and describing previously combinations of gradation values mapped to coordinate information of a graphic;
   referring to reference data having tables corresponding to features of a graphic and classified by the features and describing gradation values mapped to coordinate information of a graphic;
   discriminating, by a computer, said features in said design graphic data near positions of said spotlights; and
   selecting and combining the gradation values described previously in said table of the reference data corresponding to the features on the bases of coordinate information of the positions of said spotlights, thereby determining a two-dimensional array pattern of the gradation values,
   wherein the features of the graphic includes at least one of an area divided by one straight line, an area divided by two parallel straight lines, an area divided by two half lines having the same end point, and an undivided area.

2. The method according to claim 1, further comprising the steps of:
   referring to, as coordinate information of a graphic, distance information of a center point of the spotlight from a feature position of the graphic and discrimination information as to whether or not the center point of the spotlight is present within the graphic; and
   determining, based on said distance information and said discrimination information, a feature area of said graphic to which the center point of the spotlight belongs.

3. The method according to claim 1, further comprising the step of mapping two spotlights in an area divided by one straight line.

4. The method according to claim 1, further comprising the steps of mapping spotlights located on inner and outer sides of said end point, in an area divided by two half lines having the same end point.

5. The method according to claim 1, further comprising the step of mapping three spotlights in an area divided by two parallel straight lines.

6. The method according to claim 1, further comprising the step of mapping one spotlights in an undivided area.

7. A device for generating data including gradation values of intensities due to duplication of spotlights based on design graphic data for use in an exposure system, said device comprising:
   a digital micromirror unit provided for irradiating multigradation-controllable spotlights in a two-dimensional array onto a photosensitive film on a substrate in a patterning process, wherein gradation values of said spotlights is based on design graphic data,
   memory means for storing reference data classified by features of a graphic and describing gradation values mapped to coordinate information of a graphic,
   gradation value determining means for referring to said reference data having tables corresponding to features of a graphic and classified by the features and describing previously combinations of gradation values mapped to coordinate information of a graphic;
   means for discriminating said features in said design graphic data near positions of said spotlights, and
   means for selecting and combining the gradation values previously described in said table of the reference data corresponding to the features on the bases of coordinate information of the positions of said spotlights, thereby determining a two-dimensional array pattern of the gradation values, wherein the feature of the graphic includes at least one of an area divided by one straight line, an area divided by two parallel straight lines, an area divided by two half lines having the same end point, and an undivided area.

8. The device according to claim 7, wherein said gradation value determining means comprises means for referring to, as coordinate information of a graphic, distance information of a center point of the spotlight from a feature position of the graphic and discrimination information as to whether or not the center point of the spotlight is present within the graphic, and determining, based on said distance information and said discrimination information, a feature area of said graphic to which the center point of the spotlight belongs.

9. The device according to claim 7, further comprising means for mapping two spotlights in an area divided by one straight line.

10. The device according to claim 7, further comprising means for, in an area divided by two half lines having the same end point, mapping spotlights located on inner and outer sides of said end point.

11. The device according to claim 7, further comprising means for mapping three spotlights in an area divided by two parallel straight lines.

12. A data generating device according to claim 7, further comprising means for mapping one spotlight in an undivided area.

13. A non-transitory storage medium on which a program is recorded, the program being readable by a computer and being configured for generating gradation values of intensities due to duplication of spotlights based on design graphic data for use in an exposure system including a digital micromirror device provided for irradiating multigradation-controllable spotlights in a two-dimensional array onto a photosensitive film on a substrate in a patterning process, said program comprising:
   memory means for storing reference data classified by features of a graphic and describing gradation values mapped to coordinate information of a graphic,
   gradation value determining means for referring to reference data having tables corresponding to features of a graphic and classified by the features and describing previously combinations of gradation values mapped to coordinate information of a graphic,
   discriminating said features in said design graphic data near positions of said spotlights, and
   selecting and combining the gradation values described previously in said table of the reference data corresponding to the features on the bases of coordinate information of the positions of said spotlights, thereby determining a two-dimensional array pattern of the gradation values, wherein the feature of the graphic includes at least one of an area divided by one straight line, an area divided by two parallel straight lines, an area divided by two half lines having the same end point, and an undivided area.

14. The non-transitory storage medium according to claim 13, wherein said gradation value determining means comprises means for referring to, as coordinate information of a graphic, distance information of a center point of the spotlight from a feature position of the graphic and discrimination information as to whether or not the center point of the spotlight is present within the graphic, and determining, based on said distance information and said discrimination information, a feature area of said graphic to which the center point of the spotlight belongs.

15. The non-transitory storage medium according to claim 13, further comprising means for mapping two spotlights in an area divided by one straight line.

16. The non-transitory storage medium according to claim 13, further comprising means for, in an area divided by two half lines having the same end point, mapping spotlights located on inner and outer sides of said end point.

17. The non-transitory storage medium according to claim 13, further comprising means for mapping three spotlights in an area divided by two parallel straight lines.

18. The non-transitory storage medium according to claim 13, further comprising means for mapping one spotlight in an undivided area.

19. An exposure system comprising a digital micromirror unit for irradiating multigradation-controllable spotlights in a two-dimensional array onto a photosensitive film on a substrate in a patterning process, said exposure system further comprising:
    data generating means for generating drawing data; and
    control means for controlling irradiation positions of said spotlights and exposure of said spotlights based on the drawing data from said data generating means,
    wherein said data generating means comprises:
        memory means for storing reference data classified by features of a graphic and describing gradation values mapped to coordinate information of a graphic,
        gradation value determining means for referring to said reference data having tables corresponding to features of a graphic and classified by the features and describing previously combinations of gradation values mapped to coordinate information of a graphic;
        means for discriminating said features in said design graphic data near positions of said spotlights, and
        means for selecting and combining the gradation values previously described in said table of the reference data corresponding to the features on the bases of coordinate information of the positions of said spotlights, thereby determining a two-dimensional array pattern of the gradation values.

20. The exposure system according to claim 19, wherein said gradation value determining means comprises means for using, as coordinate information of a graphic, distance information of a center point of the spotlight from a feature position of the graphic and discrimination information as to whether or not the center point of the spotlight is present within the graphic, and determining, based on said distance information and said discrimination information, a feature area of said graphic to which the center point of the spotlight belongs.

21. The exposure system according to claim 19, wherein the data generating means further comprises means for mapping two spotlights in an area divided by one straight line.

\* \* \* \* \*